(12) United States Patent
Kiehl et al.

(10) Patent No.: US 6,275,082 B1
(45) Date of Patent: Aug. 14, 2001

(54) RECEIVER WITH SWITCHED CURRENT FEEDBACK FOR CONTROLLED HYSTERESIS

(75) Inventors: Oliver Kiehl, Charlotte; Russ Houghton, Essex Junction, both of VT (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/519,104

(22) Filed: Mar. 6, 2000

(51) Int. Cl.$^7$ ........................................................ H03K 3/12
(52) U.S. Cl. ........................ 327/205; 327/108; 327/206
(58) Field of Search ........................... 327/108–112, 205, 327/206, 379, 389, 552

(56) References Cited

U.S. PATENT DOCUMENTS

| | | | |
|---|---|---|---|
| 4,431,930 | 2/1984 | Monticelli | 327/205 |
| 4,575,859 | 3/1986 | Ollendick | 327/309 |
| 4,745,365 | 5/1988 | Ugenti | 327/37 |
| 4,775,807 | 10/1988 | Bukowski, Jr. | 327/72 |
| 5,065,412 | 11/1991 | Schenk | 375/362 |
| 5,327,072 | 7/1994 | Savignac et al. | 323/313 |
| 5,640,104 | * 6/1997 | Matsubara | 327/206 |
| 5,796,281 | 8/1998 | Saeki et al. | 327/206 |
| 5,808,496 | * 9/1998 | Thiel | 327/206 |
| 6,163,190 | * 12/2000 | Takai et al. | 327/205 |

OTHER PUBLICATIONS

Figures from: Baker et al., *CMOS Circuit Design, Layout and Simulation*, IEEE Press, 1998.

* cited by examiner

*Primary Examiner*—Kenneth B. Wells
(74) *Attorney, Agent, or Firm*—Stanton C. Braden

(57) ABSTRACT

A receiver circuit, in accordance with the present invention, includes a first stage having an input for receiving input signals and an output node. The first stage includes an amplifier, and a second stage includes an input coupled to the output of the first stage. The second stage also includes a logic gate coupled to the output of the first stage, the logic gate having an output representing the output of the receiver circuit, and a feed back element coupled from the logic gate output and connecting to a switching element. The switching element, being responsive to the logic gate output, switches a current source on and off to adjust a switchpoint of the receiver circuit.

30 Claims, 9 Drawing Sheets

RECEIVER WITH SWITCHED CURRENT FEEDBACK FOR CONTROLLED HYSTERESIS

BACKGROUND

1. Technical Field

This disclosure relates to noise suppression and more particularly, to an apparatus and method for noise suppression by employing hysteresis.

2. Description of the Related Art

Analog circuits often include noisy signals. Noisy signals may result in bit errors when converting the analog signals to digital signals. Noise suppression can reduce noise. For example, in receiver circuits that convert (noisy) analog input signals to digital on-chip signals hysteresis is one desired means to suppress noise. In instances of slope reversal of ill terminated signal traces and extremely slow transitions (e.g., in burn-in test setups for semiconductor device tests) superimposed with random noise can cause incomplete pulses and spikes of the on-chip digital signals. This can cause malfunction of circuitry that assumes certain minimum and maximum pulse widths.

A structure of a differential amplifier-based receiver is shown in FIG. 1. A first stage 10 includes an N-channel differential pair 11 with a P-channel current mirror 13. A second stage 12 is realized by an inverter 14. One advantage of this configuration is that a switch-point is very well defined by the reference voltage VREF. The switch-point is the input voltage level (VIN) at which the output switches. For good system performance, a hysteresis of about 5–10% of the input voltage (VIN) swing is desirable. For stub series terminated logic (SSTL-2, for example), this would be about a few tens of mV's.

The prior art realization of receivers with hysteresis does not typically provide sufficient hysteresis control. The prior art provides weak controllability (i.e. achieving a small shift of the switch point based on the output state) or slow reaction time (i.e. capability to suppress fast noise spikes).

In U.S. Pat. No. 5,796,281, adding additional current to an output node of a first stage (differential amplifier) creates hysteresis. Note however, that the amount of current added is not well controlled and thus the amount of hysteresis is not well controlled. To achieve small hysteresis the transistors (for example, Q2 in U.S. Pat. No. 5,796,281) that switch the additional current have to be a small fraction of the size of main transistors of the amplifiers in U.S. Pat. No. 5,796,281. For speed purposes, however, these transistors are close to their minimum size already. Thus, it is very difficult, if not impossible, to achieve small and controlled amounts of hysteresis. Note that a hysteresis, which is too large, will also adversely affect speed. FIGS. 26.4 and 26.5 of Baker et al., "CMOS Circuit Design, Layout and Simulation," IEEE press 1998, also show circuitry for providing additional current at an output node of a first stage to attempt to control hysteresis. This circuit suffers from the same drawbacks as described above.

In other attempts to introduce controlled small amounts of hysteresis, a reference voltage is shifted based on the output state of the receiver. Although some controllability is achieved, the switching process takes too long to effectively help suppress noise spikes. It also requires two reference voltage generators, which cause additional current consumption. See e.g., U.S. Pat. No. 4,775,807.

In U.S. Pat. No. 4,745,365, the solution described consumes even more power by utilizing two receivers with offset VREF. Both receivers have to run at the same speed.

Therefore, a need exists for an apparatus for reliably controlling hysteresis for noise suppression in analog to digital conversions.

SUMMARY OF THE INVENTION

A receiver circuit, in accordance with the present invention, includes a first stage having an input for receiving input signals and an output node. The first stage includes an amplifier, and a second stage includes an input coupled to the output of the first stage. The second stage also includes a logic gate coupled to the output of the first stage, the logic gate having an output representing the output of the receiver circuit, and a feed back element coupled from the logic gate output and connecting to a switching element. The switching element, being responsive to the logic gate output, switches a current source on and off to adjust a switchpoint of the receiver circuit.

Another receiver circuit, in accordance with the present invention, includes a first stage having an input for receiving input signals. The first stage includes an amplifier with a first node employed as an output and a second node. A second stage has an input coupled to the first node. The second stage further includes a logic gate having an input coupled to the first node, the logic gate having an output representing the output of the receiver circuit, and a switching element coupled to the first node and being responsive to the first node for switching a current source on and off such that the current source adjusts a current at the first node to control a switchpoint at the logic gate output. A feed back element is coupled to the switching element and connects to the second node of the amplifier for providing feedback for adjusting the current at the first node.

In other embodiments, the switching element may include a transistor or a pair of transistors. The pair of transistors may include one P-channel transistor and one N-channel transistor. The current source may be coupled in series with the P-channel transistor and/or in series with the N-channel transistor. The amplifier of the first stage may include a transconductance amplifier or may include a differential amplifier including a base current source having a base current output therefrom and the current source is adjusted in accordance with the base current. The current at the output of the first stage may be adjusted by between about 1% to about 20%. The receiver includes a hysteresis, which may be controlled in accordance with a linear relationship with current from the current source. The receiver circuit may be included on a semiconductor chip. The receiver circuit input signals may include analog signals and the receiver circuit preferably suppresses noise of the analog signals. The logic gate output may include a digital logic state. The receiver circuit may include a power down circuit for turning the amplifier off when inactive. The logic gate may include an inverter.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to noise suppression, and more particularly to controlling hysteresis as a way of controlling noise. The present invention will be described in terms of an illustrative receiver circuit using field effect transistors; however, the present invention should not be construed as limited by the illustrative circuits. Instead, variations to the circuits described herein, as well as, other circuits and logic standards (e.g., SSTL, TTL, etc.) may enjoy the benefits of the present invention.

The present invention includes a switched current feedback (or feed forward) apparatus. The present invention includes a circuit to adjust a switch point of a receiver by adding or subtracting a small and controlled amount of current. In one embodiment, a controlled amount of current is delivered to a high impedance output node of an input stage of the receiver by a current source which is of high impedance like the output. The feedback is preferably implemented by two elements. One element defines the amount of feedback current and one element includes a switch, which may be controlled by, for example, the output of the receiver, to turn this current on or off. It is also to be understood that the transistors for the circuits shown may be changed, for example, p-channel transistors changed to n-channel transistors and vice versa, along with changing the poles, VDD to ground and ground to VDD. In one embodiment, p-channels transistor may be desirable at appropriate locations in the circuits to provide SSTL-1, SSTL-1.8, SSTL-2.5 logic or other logic. (SSTL is stub series terminated logic, known to those skilled in the art.)

Figure 1:
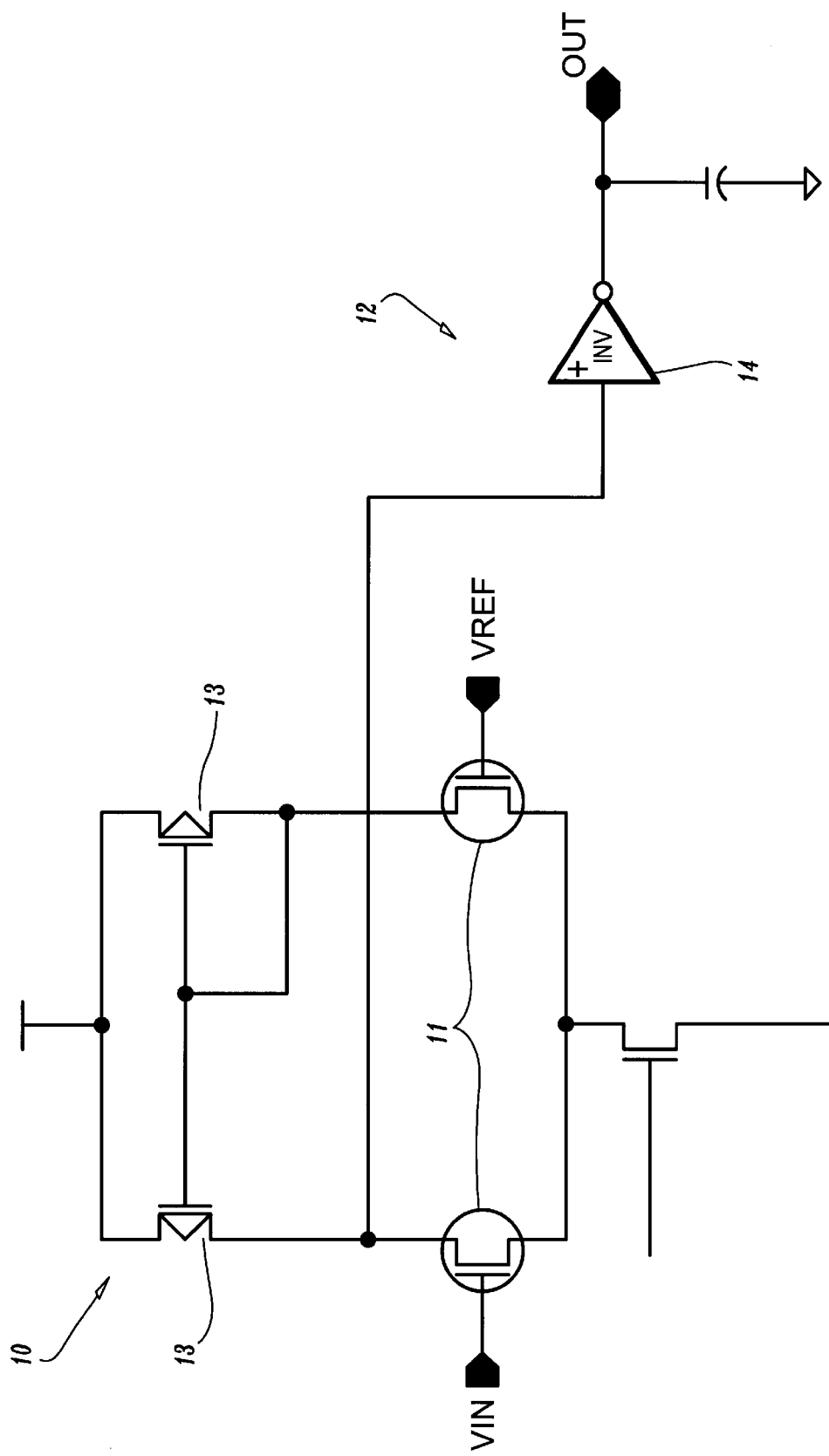
FIG. 1 is a schematic diagram showing a prior art receiver circuit with insufficient hysteresis control.
Figure 2:
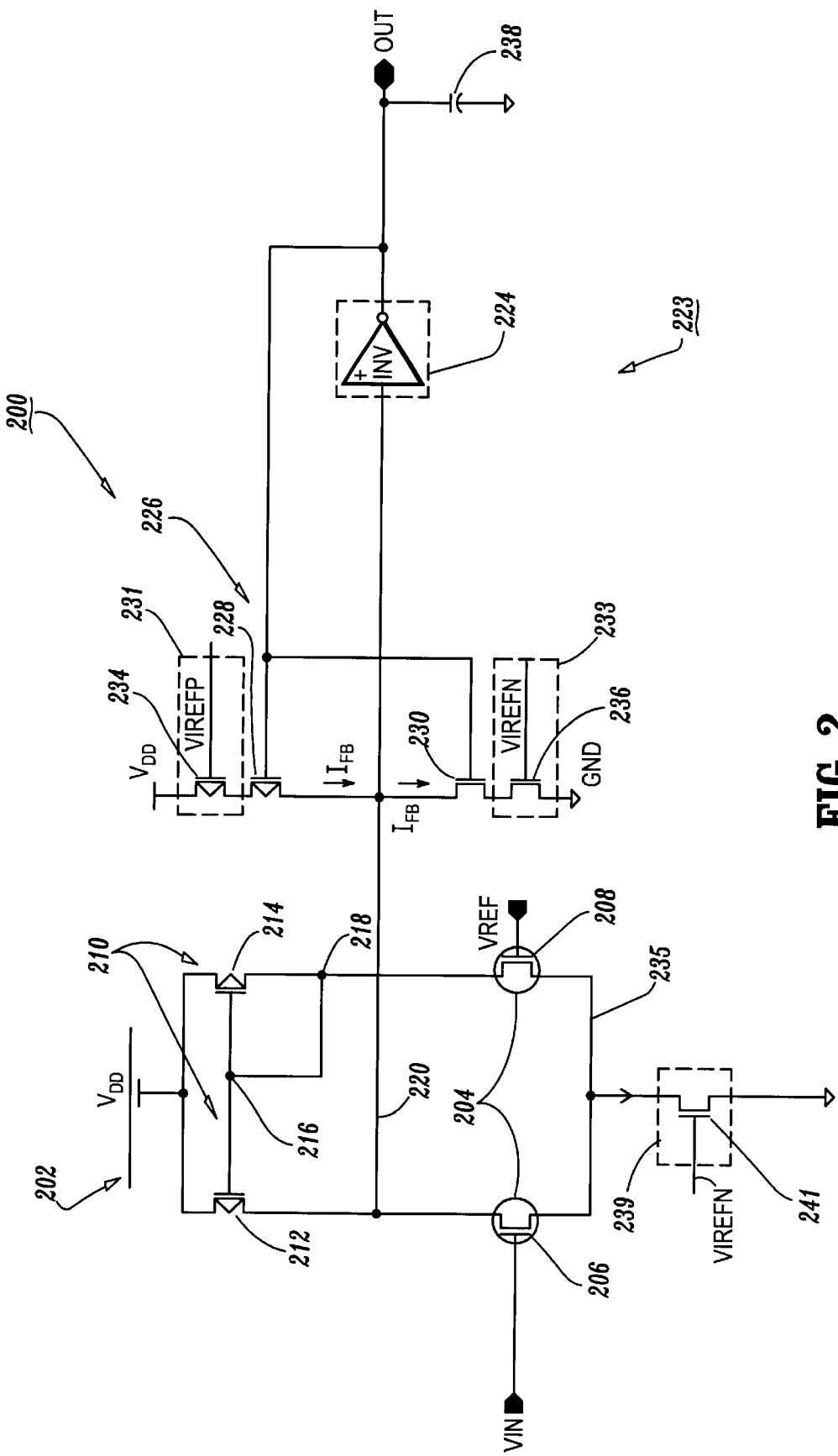
FIG. 2 is a schematic diagram showing a receiver circuit in accordance with one embodiment of the present invention.
Figure 7:
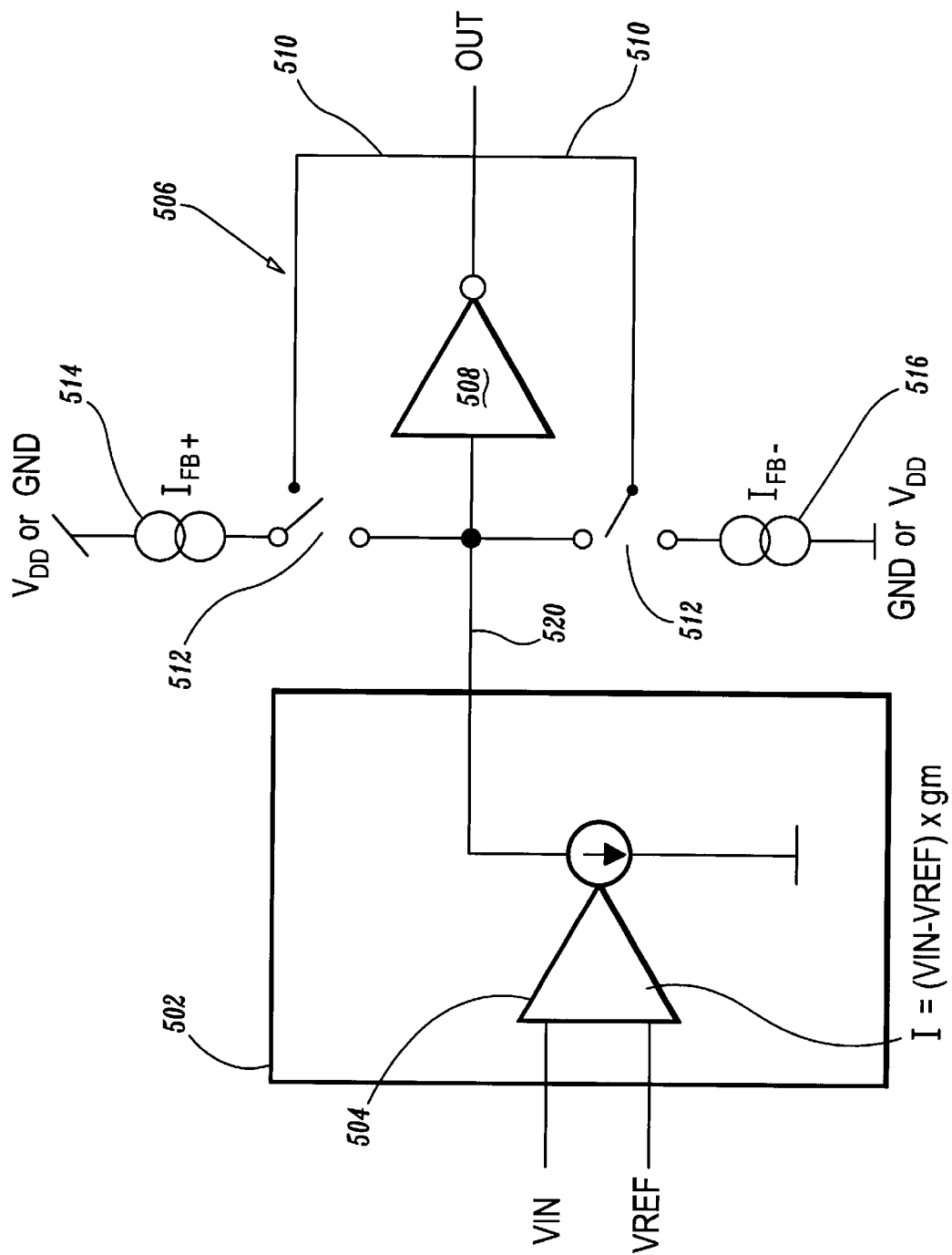
FIG. 7 is a schematic diagram showing a receiver circuit including a first stage of the receiver circuit with a transconductance amplifier in accordance with yet another embodiment of the present invention.

Referring now in specific detail to the drawings in which like reference numerals identify similar or identical elements throughout the several views, and initially to FIG. 2, a schematic diagram of an illustrative embodiment of the present invention is shown. A receiver circuit 200 includes a first stage 202, which includes an amplifier, preferably, a differential amplifier employed for noise suppression. In one embodiment, first stage 202 includes a transconductance amplifier as shown in FIG. 7. Other amplifiers may be employed for first stage 202 as well, for example a CAS-CODE amplifier may be employed. Circuit 200 includes an input (VIN) which preferably receives analog signals. First stage 202 may include an N-channel differential pair 204. A first N-channel transistor 206 has a gate connected to VIN for receiving input signals. A second N-channel transistor 208 includes a gate connected to a reference voltage VREF.

A P-channel current mirror 210 is also included. A first transistor 212 and a second transistor 214 of P-channel current mirror 210 include gates, which are connected at node 216. The gates of transistors 212 and 214 are also connected to node 218. A node 220 is connected to transistors 212 and 206. Node 220 is an output node of first stage 202 (output of the differential amplifier) and connects to a second stage 223.

Second stage 223 of circuit 200 includes a logic gate 224, such as an inverter, an AND gate, an OR gate or other logic gate and a switched current feedback element 226 in accordance with the present invention. Feedback element 226 connects to an output of inverter 224 and gates of transistors 228 and 230. In this way, positive feedback is generated by adding or subtracting a portion of the differential amplifier (first stage 202) base current in node 220 (output node of first stage 202) of the receiver circuit 200 based on the logic state of output node (OUT) of the receiver circuit 200.

Transistors 228 and 230 are P-channel and N-channel transistors, respectively. Transistor 228, when enabled by an appropriate logic state from OUT, provides a conductive path between a node 220 and a supply voltage VDD. Transistor 230, when enabled by an appropriate logic state from OUT, provides a conductive path between node 220 and a ground (GND). The baseline current from first stage 202 is adjusted depending on the logic state of OUT and current source 231 or current source 233.

The feedback and switching provide a small and controlled amount of current to output node 220. The controlled amount of current is delivered to output node 220 of an input stage (first stage 202) of the receiver circuit by at least one current source (e.g., current source 231 or 233). The current source (or current sink) is illustratively shown as transistors 234 and 236, which are enabled by VIREFP (Voltage Reference Current P) and VIREFN (Voltage Reference Current N), respectively. Other types of current sources may be employed. In one embodiment, VIREFP and VIREFN are tied to first stage 202 at node 235 to track the current output of the differential amplifier. A current source tracks the current output at node 220 (e.g., a same current flows through current source 239 from node 235 to ground as the resultant current from node 220). Advantageously, VIREFP and VIREFN may be derived from this current from node 235. Current source 239 may include a transistor 241, although other current sources may be employed. In this way, current provided from current sources 231 and/or 233 track the base current of the differential amplifier of first stage 202.

VIREFP and VIREFN may be controlled by other circuits to vary the current delivered to node 220. The current sources 231 or 233 are preferably of high impedance, like the output, which also includes a high impedance, e.g., operating at the transistors' saturation region. A capacitor 238 to ground is shown to represent the impedance of a semiconductor chip of other circuits connected at OUT. In an illustrative example, current source 239 at 100 MHz generates a current of about 100 micro-amps. A transistor 241 of current source 239 is larger than transistors 204, 212 and 214, which all have similar size. Further transistors 234 and 236 are smaller than transistors 204, 212 and 214. Smaller still are transistors 228 and 230.

The feedback is preferably implemented by two elements. One element defines the amount of feedback current (current sources 231 or 233 (e.g., transistors 234 and 236)) and one element includes a switch (transistors 228 and 230) which may be controlled by the output of the receiver circuit, to turn this current on or off.

The Hysteresis H is given by:

$H=I_{FB}/g_m$ (where $g_m$ is the transconductance of first stage 202 and $I_{FB}$ is a small portion of the source current from node 235 (which mirrors the current from node 220) using a current source 239 of first stage 202. Advantageously, H is virtually independent of VDD. This is a significant difference from prior art techniques.

$I_{FB}$ is controlled in accordance with the present invention and therefore provides improved control of H. The small portion of current may preferably include about 1% to about 20% of source current (from current source 239 (= node 220 current) which controls VIREFP and VIREFN, in one embodiment), and more preferably less than about 4%. Advantageously, the dependency of the hysteresis on process parameters and temperature is significantly reduced in accordance with the present invention.

Note that the source current of first stage 202 (differential amplifier) may be defined by a fairly large transistor 241, for example, (it is a DC current after all); thus, it is easy to produce a small fraction of that current (say, for example, 4%) without requiring sub-groundrule transistor dimensions. For example, proportions of transistors are to be maintained as described by the relative sizes of transistors, as set forth above. Transistor 241 may be 200 microns in width while transistors 204 are 10 microns wide and transistor 236 is 8 microns wide. Current fractions are achieved without sub-groundrule dimensions. These relative values are illustrative and are scaleable to other technologies.

Simulation Results

Figure 3:
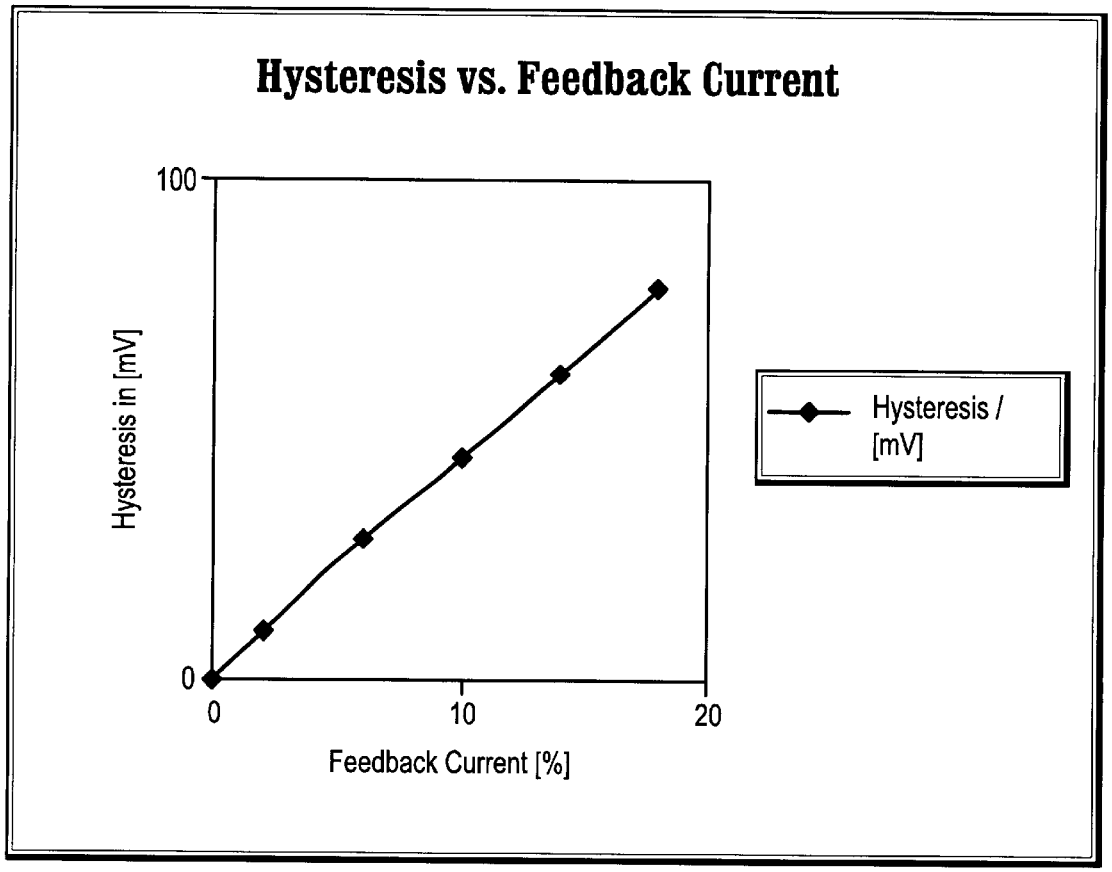
FIG. 3 is a plot showing a linear relationship between hysteresis and control current for a receiver circuit in accordance with one embodiment of the present invention.

Referring to FIG. 3, simulation results are shown for circuit 200 of the present invention. FIG. 3 shows hysteresis versus feedback current. Note the linearity of the curve indicating the remarkable control over the hysteresis as a function of feedback current ($I_{FB}$). FIG. 3 shows simulation results of the configuration of FIG. 2 with SSTL-2 input voltage (1V/ns slew rate).

Figure 4:
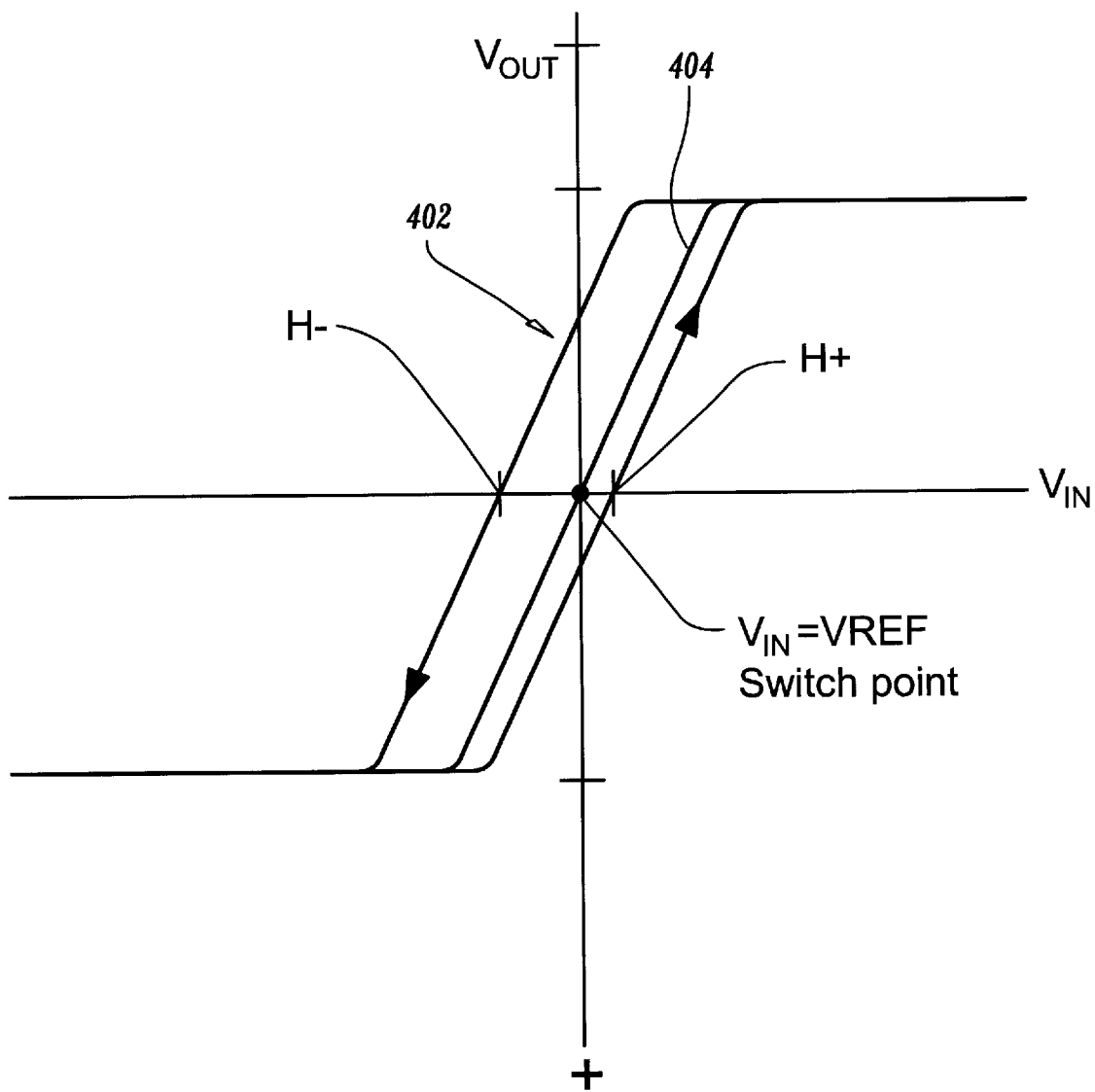
FIG. 4 is a plot showing hysteresis for switchpoint adjustment in accordance with the present invention.

By increasing the current of the input or first stage, delay in circuit 200 can be reduced, perhaps, at the cost of additional power. Another advantage of the present invention is that a hysteresis window is adjustable. Referring to FIG. 4, a hysteresis window 402 is shown. Hysteresis H may be adjusted about a nominal switchpoint (e.g., on the line 404 having no $I_{FB}$; switch point is at VIN=VREF). In one embodiment, H+ are equal H− (e.g., symmetric about the switchpoint), however, H+ and H− may be adjusted about the nominal switch point as needed, in accordance with the invention.

Figure 5:
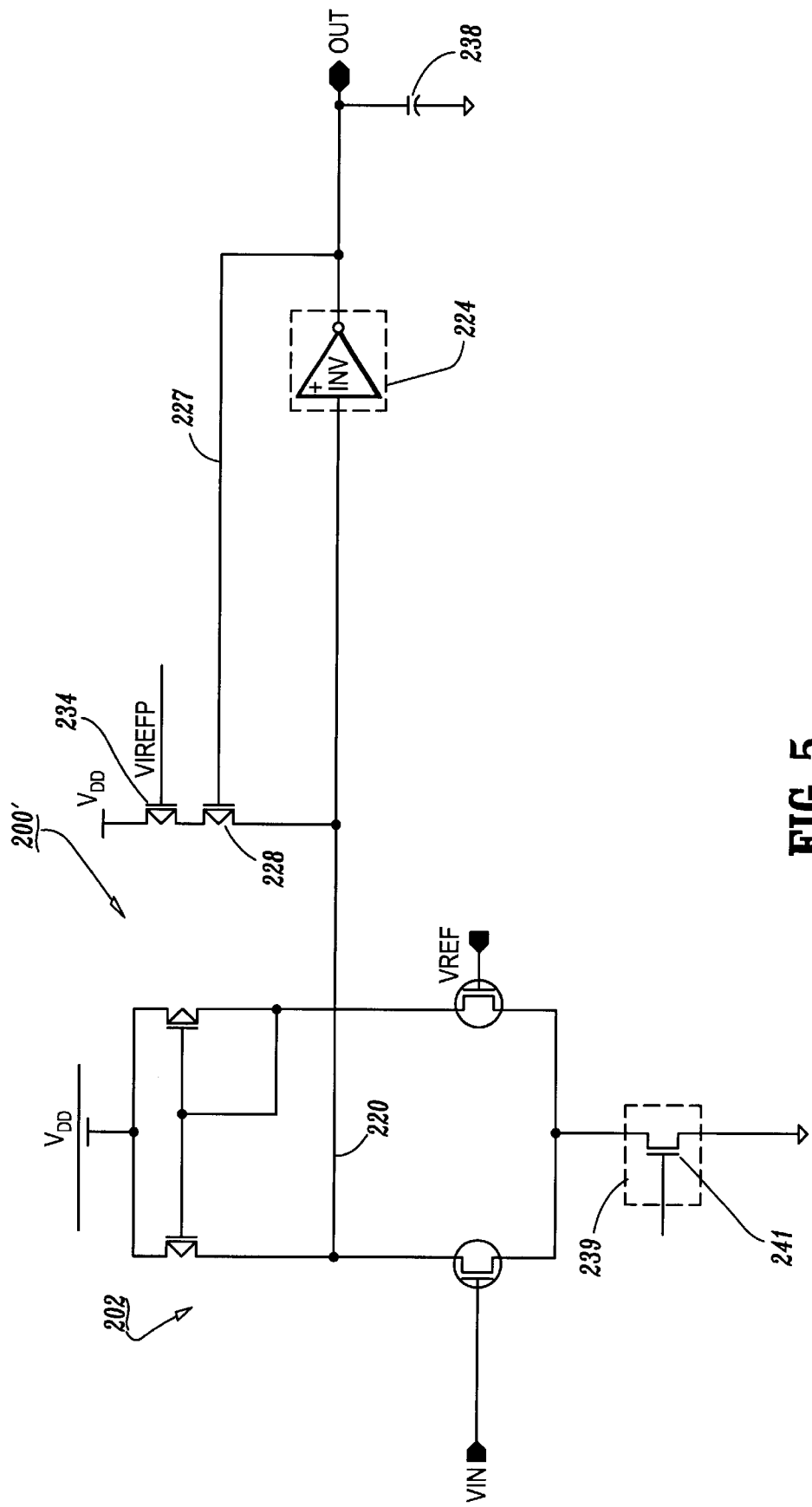
FIG. 5 is a schematic diagram showing a receiver circuit having one arm of the switched feedback of FIG. 2 in accordance with another embodiment of the present invention.

Referring to FIG. 5, an alternative embodiment of the present invention is shown. A circuit 200' includes the configuration of circuit 200, but implements only one arm 227 of the feedback element 226 (FIG. 2) creating an asymmetric hysteresis. Alternately, this configuration may be reversed to connect to transistor 230 (FIG. 2) instead of transistor 228. The asymmetrical hysteresis can be for non-symmetric logic levels, such as for example transistor-transistor logic (TTL).

Figure 6:
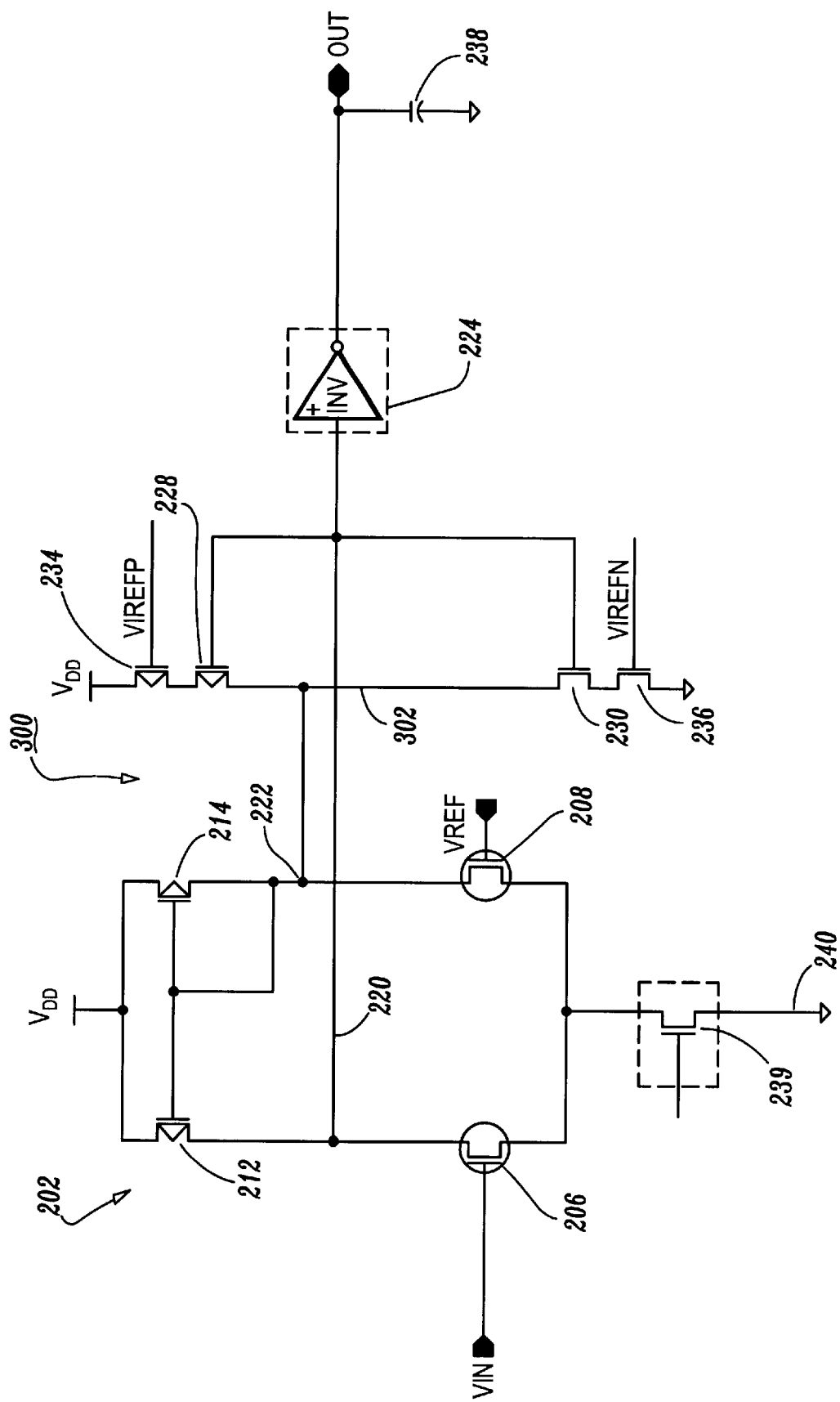
FIG. 6 is a schematic diagram showing a receiver circuit having the switched feedback controlled by an output node of a first stage of the receiver circuit in accordance with yet another embodiment of the present invention.

Referring to FIG. 6, another embodiment of the present invention includes a different structure. A circuit 300 includes a feedback switch (transistors 228 and 230) which is controlled by node 220. Conducting transistor 228 (or 230) supplies current to node 302 which is fed back to node 222 to adjust current on node 220 of first stage 202.

The time for shifting the switch point is improved in circuit 300. Therefore, the noise suppression may be superior; however, increased delay may be experienced due to the increased capacitive loading of node 220.

So while for some technologies, circuit 300 may be advantageous, the preferred embodiment for the investigated 0.25 microns to 0.15 micron technologies is circuit 200.

Referring to FIG. 7, another embodiment of the present invention shows a first stage 502 including a transconductance amplifier 504. A second stage 506 includes a logic gate, such as an inverter 508 or other logic gate. A feed back element 510 is included and switches 512 switch current sources 514 and 516 on and off to provide current ($I_{FB}$+ or $I_{FB}$−) to and from node 520. Current $I_{FB}$+ and/or $I_{FB}$− track the transconductance ($g_m$) of amplifier 504. The transconductance influence may be modified as would be known to those skilled in the art to achieve different relationships between source current of first stage 502 and $I_{FB}$+ and/or $I_{FB}$− in accordance with the invention.

Figure 8:
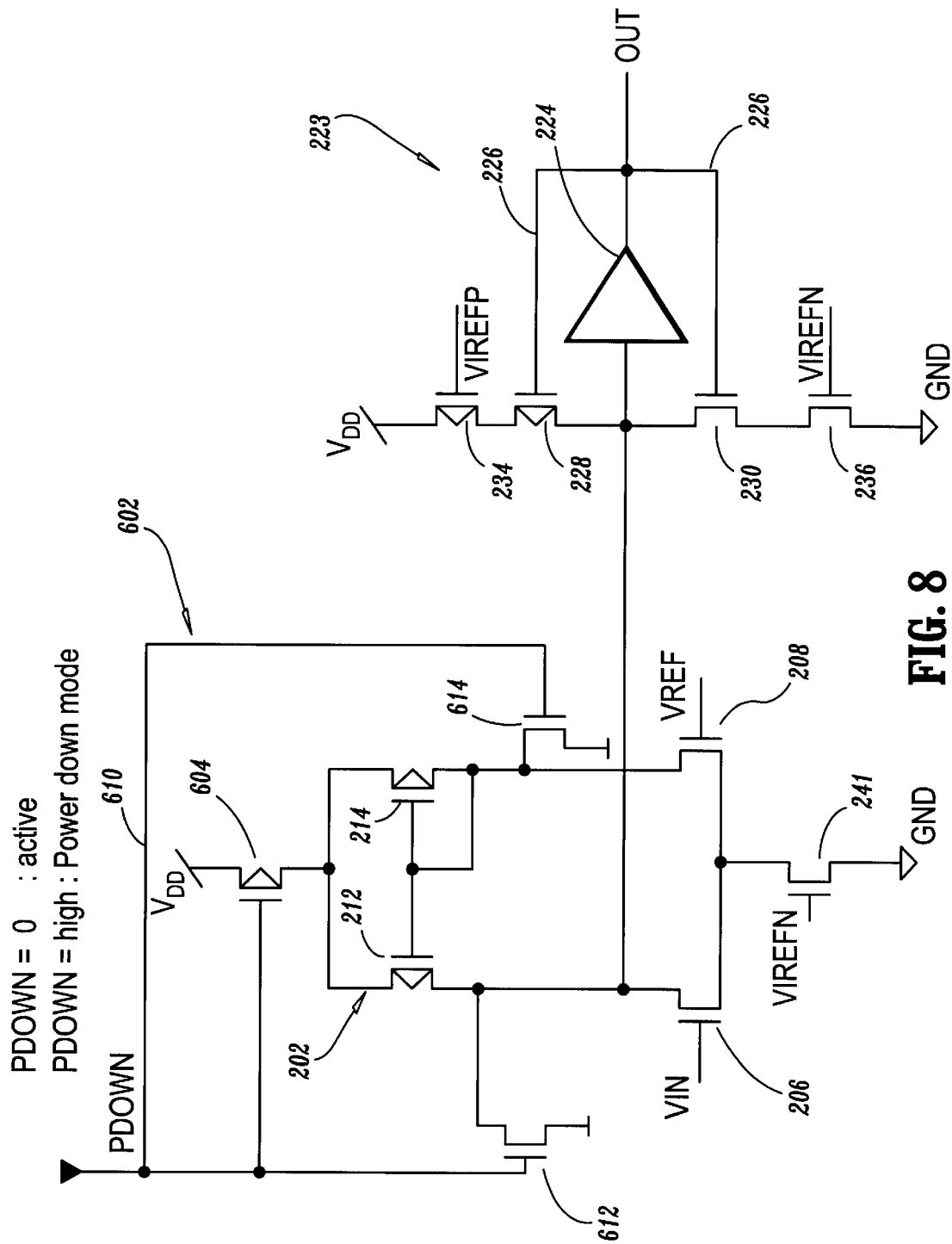
FIG. 8 is a schematic diagram showing a receiver circuit having a power down circuit in accordance with yet another embodiment of the present invention.
Figure 9:
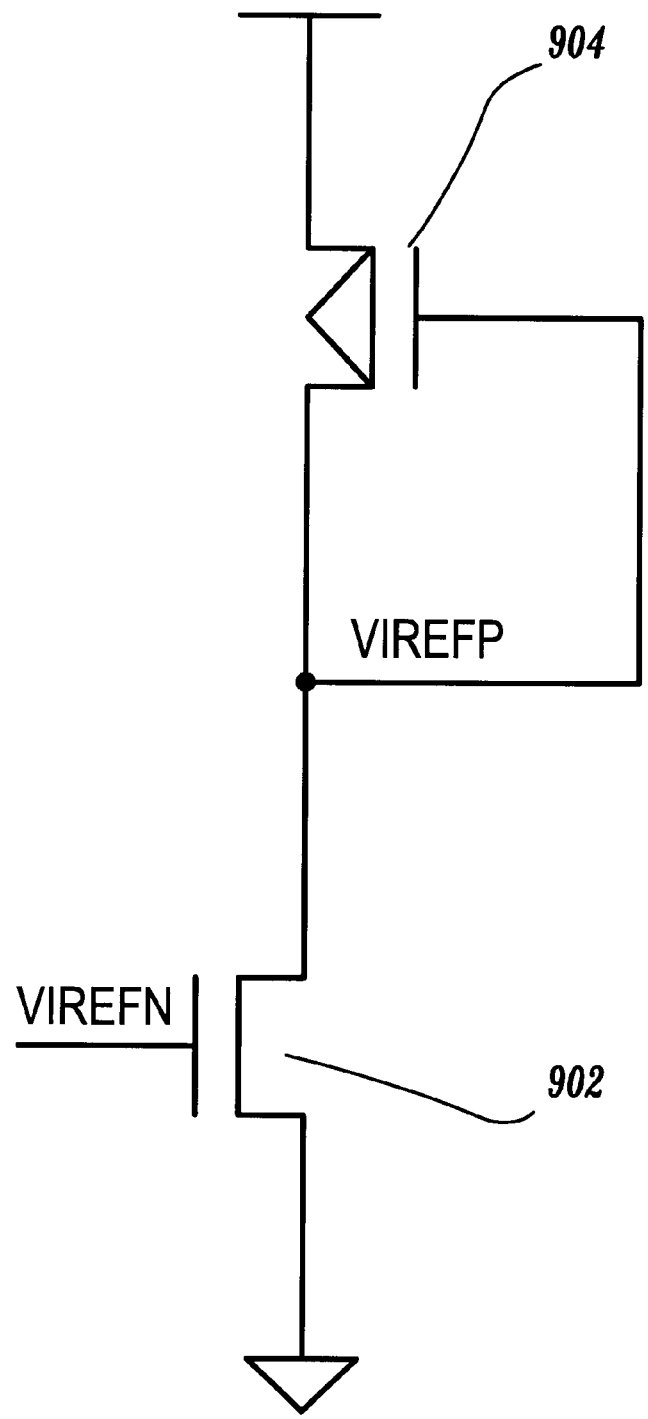
FIG. 9 is a schematic diagram showing a circuit for generating VIREFP (or alternately VIREFN) in accordance with one embodiment of the present invention.

Referring to FIG. 8, another embodiment of the present invention includes a power down circuit 602. Power down circuit 602 includes a logic circuit which disables first stage 202 (or, alternately, first stage 502) in an inactive state. A PDOWN input bit connects the amplifier of first stage 202 to VDD through transistor 604. Otherwise, the amplifier is shorted through path 610 using transistors 612 and 614. In this way, power is conserved when the circuit is not active. Also shown in FIG. 8, VIREFN is applied to a gate of transistor 241. In one illustrative example, VIREFP is generated as shown in FIG. 9. As illustratively shown in FIG. 9, transistors 902 and 904 are employed to convert VIREFN to VIREFP. Other circuits or methods are also contemplated.

It is to be understood that the present invention may be employed in a plurality of different applications. For example, the present invention may be implemented on a semiconductor memory chip or other semiconductor device for receiving analog input signals and converting the input signals to digital pulses after noise suppression. Other applications may include, but are not limited to telephony or signal processing applications. By adjusting hysteresis in accordance with the present invention, time is conserved by the overall circuit, noise is efficiently suppressed and the reliability of the received signals is improved.

Having described preferred embodiments for a receiver with switched current feedback controlled hysteresis (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A receiver circuit comprising:
 a first stage having an input for receiving an input signal and an output node, the first stage including an amplifier having a base current source;
 a second stage having an input coupled to the output of the first stage, the second stage further comprising:
  a logic gate coupled to the output of the first stage, the logic gate having an output representing the output of the receiver circuit; and
  a feed back element coupled from the logic gate output and connecting to a switching element, the switching element, being responsive to the logic gate output, for switching a current source on and off to adjust a switchpoint of the receiver circuit, wherein the current source supplies a current which tracks current through the base current source.

2. The receiver circuit as recited in claim 1, wherein the switching element includes a transistor.

3. The receiver circuit as recited in claim 1, wherein the switching element includes a pair of transistors.

4. The receiver circuit as recited in claim 3, wherein the pair of transistors includes one P-channel transistor and one N-channel transistor.

5. The receiver circuit as recited in claim 4, wherein the current source is coupled in series with the P-channel transistor.

6. The receiver circuit as recited in claim 4, wherein the current source is coupled in series with the N-channel transistor.

7. The receiver circuit as recited in claim 1, wherein the amplifier of the first stage includes a transconductance amplifier.

8. The receiver circuit as recited in claim 1, wherein the amplifier of the first stage includes a differential amplifier and the base current source provides a base current therethrough and the current source tracks the base current by sharing a same voltage reference current to adjust the current source in accordance with the base current.

9. The receiver circuit as recited in claim 1, wherein a current at the output of the first stage is adjusted by the current source, by between about 1% to about 20%.

10. The receiver circuit as recited in claim 1, wherein the logic gate outputs a signal with hysteresis, an amount of hysteresis is controlled in accordance with a linear relationship with current from the current source.

11. The receiver circuit as recited in claim 1, wherein the receiver circuit is included on a semiconductor chip.

12. The receiver circuit as recited in claim 1, wherein the input signals include analog signals and the receiver circuit suppresses noise of the analog signals.

13. The receiver circuit as recited in claim 1, wherein the logic gate output includes a digital logic state.

14. The receiver circuit as recited in claim 1, further comprising a power down circuit for turning the amplifier off when inactive.

15. The receiver circuit as recited in claim 1, wherein the logic gate includes an inverter.

16. A receiver circuit comprising:

a first stage having an input for receiving an input signal, the first stage including an amplifier with a first node employed as an output and a second node, the amplifier having a base current source;

a second stage having an input coupled to the first node, the second stage further comprising:

a logic gate having an input coupled to the first node, the logic gate having an output representing the output of the receiver circuit;

a switching element coupled to the first node and being responsive to the first node for switching a current source on and off such that the current source adjusts a current at the first node to control a switchpoint at the logic gate output, wherein the current source having a current magnitude which tracks current through the base current source; and a feed back element coupled to the switching element and connecting to the second node of the amplifier for providing feedback for adjusting the current at the first node.

17. The receiver circuit as recited in claim 16, wherein the switching element includes a transistor.

18. The receiver circuit as recited in claim 16, wherein the switching element includes a pair of transistors.

19. The receiver circuit as recited in claim 18, wherein the pair of transistors includes one P-channel transistor and one N-channel transistor.

20. The receiver circuit as reclaimed in claim 19, wherein the current source is coupled in series with the P-channel transistor.

21. The receiver circuit as recited in claim 19, wherein the current source is coupled in series with the N-channel transistor.

22. The receiver circuit as recited in claim 16, wherein the amplifier of the first stage includes a transconductance amplifier.

23. The receiver circuit as recited in claim 1, wherein the amplifier of the first stage includes a differential amplifier and the base current source provides a base current therethrough and the current source tracks the base current by sharing a same voltage reference current to adjust the current source in accordance with the base current.

24. The receiver circuit as recited in claim 16, wherein a current at the output of the first stage is adjusted by the current source, by between about 1% to about 20%.

25. The receiver circuit as recited in claim 16, wherein the logic gate outputs a signal with hysteresis, an amount of hysteresis is controlled in accordance with a linear relationship with current from the current source.

26. The receiver circuit as recited in claim 16, wherein the receiver circuit is included on a semiconductor chip.

27. The receiver circuit as recited in claim 16, wherein the input signals include analog signals and the receiver circuit suppresses noise of the analog signals.

28. The receiver circuit as recited in claim 16, wherein the logic gate output includes a digital logic state.

29. The receiver circuit as recited in claim 16, further comprising a power down circuit for turning the amplifier off when inactive.

30. The receiver circuit as recited in claim 16, wherein the logic gate includes an inverter.

* * * * *